United States Patent [19]

Chen et al.

[11] Patent Number: 4,604,225

[45] Date of Patent: Aug. 5, 1986

[54] REFRACTORY OXIDE HOSTS FOR A HIGH POWER, BROADLY TUNABLE LASER WITH HIGH QUANTUM EFFICIENCY AND METHOD OF MAKING SAME

[75] Inventors: Yok Chen, Oak Ridge, Tenn.; Roberto Gonzalez, Madrid, Spain

[73] Assignee: The United States of America as represented by the Secretary of the Department of Energy, Washington, D.C.

[21] Appl. No.: 751,405

[22] Filed: Jul. 3, 1985

[51] Int. Cl.$^4$ .............................................. C09K 11/12
[52] U.S. Cl. ............................. 252/301.4 R; 423/635; 423/636; 423/647
[58] Field of Search ................. 252/301.4 R; 423/636, 423/647, 648

[56] References Cited

U.S. PATENT DOCUMENTS

| | | | |
|---|---|---|---|
| 3,766,490 | 10/1973 | Strozyk | 252/301.4 R |
| 3,829,391 | 8/1974 | Chen et al. | 423/637 |
| 3,845,408 | 10/1974 | Cooley | 252/301.4 R |
| 3,925,235 | 12/1975 | Lee | 252/301.4 R |
| 4,315,832 | 2/1982 | Pastor et al. | 252/301.4 R |
| 4,330,525 | 5/1982 | Reynolds et al. | 423/636 |
| 4,427,570 | 1/1984 | Chen et al. | 423/636 |
| 4,441,049 | 4/1984 | Verstegen et al. | 252/301.4 R |
| 4,545,975 | 10/1985 | Kobayashi et al. | 423/636 |

OTHER PUBLICATIONS

Crawford et al., "Point Defects in Solids", by Plenum Press, New York (1972).
Edel et al., J. Phys. C., Solid State Phys., vol. 12, pp. 5245–5252 (1979).
Gonzales et al., Phys. Rev. B, vol. 24, No. 12, pp. 6862–6868 (Dec. 15, 1981).
Henderson et al., Phys. Rev., vol. 183, No. 3, pp. 826–831 (Jul. 13, 1969).
Welch et al., J. Phys. C., Solid State Phys., vol. 13, pp. 1791–1804 (1980).
Jeffries et al., Physical Rev. B, vol. 25, No. 3, pp. 2077–2080, Feb. 1, 1982.

*Primary Examiner*—Andrew H. Metz
*Assistant Examiner*—Anthony McFarlane
*Attorney, Agent, or Firm*—David E. Breeden; Stephen D. Hamel; Judson R. Hightower

[57] ABSTRACT

Refractory oxide crystals having high-quantum efficiency and high thermal stability for use as broadly tunable laser host materials. The crystals are formed by removing hydrogen from a single crystal of the oxide material to a level below about $10^{12}$ protons per cm$^3$ and subsequently thermochemically reducing the oxygen content of the crystal to form sufficient oxygen anion vacancies so that short-lived F$^+$ luminescence is produced when the crystal is optically excited.

10 Claims, 3 Drawing Figures

REFRACTORY OXIDE HOSTS FOR A HIGH POWER, BROADLY TUNABLE LASER WITH HIGH QUANTUM EFFICIENCY AND METHOD OF MAKING SAME

BACKGROUND OF THE INVENTION

This invention, which is a result of a contract with the U.S. Department of Energy, relates to crystals and methods of making the same having desirable luminescence characteristics for use as host materials in high-power, broadly tunable lasers.

It has long been known that refractory oxide crystals luminesce when optically excited through exposure to particular wavelengths of light, and this phenomenon is used to advantage in various devices such as lasers, photon detectors, image converters, and other quantum-electronic solid-state devices.

In general, both impurities and vacancies in a given crystal give rise to optical absorption bands, which when optically excited result in luminescence. These crystals have been used as laser host materials whose outputs may be tuned to yield monochromatic coherent light over a certain wavelength region covered by the luminescence spectrum of the crystal. Lasers using impurities have been much more common because impurities (such as chromium in the classic ruby laser) are thermally more stable than lasers using vacancies. However, vacancies have three main advantages over impurities: (1) The oscillator strength of the absorption is generally much higher; therefore, the required concentration of the lasing species is much lower. For many impurity ions, the oscillator strengths are small (approx. $10^{-5}$) and concentrations of approximately 1% are required. This magnitude can normally be expected to yield complications involving alloying, precipitations and severe grain boundary problems. For vacancies, the oscillator strengths in absorption is typically unity and therefor concentrations of only approximately 0.0001% are adequate. (2) The broader luminescence bands offer a broader tuning range. The half-widths of absorption bands and luminescence bands of vacancies are larger than those of impurities, typically a 5:1 ratio. (3) The broad absorption bands permit optical pumping by a correspondingly broad wavelength spectrum of an incoherent exciting source.

However, there are two disadvantages of vacancies in refractory oxide crystal systems (such as MgO, CaO, $AL_2O_3$, etc.) for high power tunable laser hosts, as compared with impurities: (1) the thermal instability of vacancies produced by conventional methods, such as irradiations with electrons or neutrons, and (2) luminescence in thermochemically reduced crystals is long-lived (greater than approximately 1 second).

In the art it has been the practice to produce vacancies in refractory oxide crystals by exposing single crystals of the oxide to either electron or neutron radiation over an extended period of time at about 300° K. This technique is disclosed by B. Henderson in *Optics Letters*, Vol. 6, No. 9, pp. 437–439 (September 1981). Vacancies produced in this manner are not stable because they are annihilated at temperatures not much higher than room temperature, thus restricting their use to low power laser applications. These crystals must be cooled to prevent annihilation of the vacancies by interstitial-vacancy recombniation. Furthermore, cooling is necessary to obtain acceptable quantum efficiency. Another shortcoming of the irradiated crystals is that exciting into the absorption band of the F+ center gives rise to trapped hole centers which are a detriment to continuous-wave (cw) tunable laser action. Irradiated oxide crystals are not desirable hosts for cw tunable lasers.

In general, anion vacancies in oxides assume two charge states: the one-electron F+ center and the two-electron F center. While the absorption bands of these two charge states in most oxides occur at different wavelengths, in MgO they coincide at 5.0 eV (250 nm). In MgO, CaO and SrO irradiated with energetic particles, the preferred charge state is the F+ center. Excitation of MgO with 5.0 eV light produces the F+ luminescence at 3.1 eV (395 nm) with a FWHM (full width at half maximum) of 0.6 eV. Such broad emission in principle permits a broad tuning range forlaser action. When the electron of an F+ center is in an excited state, the strong polarization at the vacancy demands an electron from a nearby O=ion, thereby leaving behind a hole. The hole migrates and is trapped by a magnesium vacancy charge-compensated by an impurity inherently present in MgO crystals, such as $Al^{3+}$ and $H^{30}$, to form the $V_{Al}$ or $V_{OH}$ centers, whose linear configurations are $Al^{+3}$—[Mg vacancy]—$O^-$ and $OH^{13}$—[Mg vacancy]—$O^-$, respectively. The $O^-$ refers to an O=ion with a trapped hole. These trapped hole centers give rise to broad absorption bands with a FWHM of 1.1 eV at 300° K., with peaks at about 2.3 eV (540 nm). This photoconversion effect was exhibited on a nominally pure MgO crystal previously irradiated with $5.3 \times 10^{-15}$ neutrons/cm² (E >1 MeV) in the Oak Ridge Bulk Shielding Reactor. The sample temperature during irradiation was about 320° K. The sample was excited with a low-intensity 4.9 eV light, the source being a 100-watt Hg lamp in conjunction with a Bausch and Lomb monochromator set at 254 nm. The spectra before and after the excitation is shown in FIG. 1 by curves a and b, respectively. It is clear that trapped-hole centers, which absorb at 2.3 eV, are produced by the 4.9 eV light excitation. The absorption coefficient was 3 cm$^{-1}$. With a high-intensity excitation source, an absorption coefficient as large as 10 cm$^{-1}$ can be expected. These centers are metastable and have a half-life for hole-release of a few hours at 300° K. They obviously are a strong deterrent to producing cw lasing action in the region of their optical absorption.

Irradiation with high-energy electrons to produce F+ centers has essentially the same effect and offers no advantage. In fact, the concentration of the trapped-hole centers increases. Substitutional protons in the crystals are displaced by the ionizing electrons with a phenomenally large cross section (10⁸ barns), resulting in the intrinsic $V^{31}$ center (linear configuration: $O^=$—[Mg vacancy]—$O^-$). This center also absorbs at 2.3 eV but has a half-life for hole release of several months, thereby compounding an already undesirable problem. An absorption coefficient as large as 25 cm$^{-1}$ has been observed. Furthermore, electron irradiations are expensive and time consuming. Doses between 10¹⁸ and 10¹⁹ e/cm² are required. The sample temperature during irradiation cannot exceed 360° K. without annihilation. This requirement requires long irradiation time.

These considerations are not restrictied to MgO. Trapped-hole centers in several oxides have been identified by electron paramagnetic resonance studies. They generally give rise to broad absorption bands in the visible and near-visible region. In CaO and Al$_2$O$_3$ the bands peak at 1.85 and 3.0 eV, respectively.

In thermochemically reduced crystals there exists a long-lived component of the F center luminescence, which is detrimental for use as a cw laser host. It is due to the presence of hydride ions (H$^-$ ions). ions). Luminescence lifetimes of roughly $10^{-8}$ to $10^{-6}$ seconds are desirable for cw laser hosts. Therefore, the inventors have found that in order to provide a refractory oxide host for tunable cw laser applications, hydrogen must be removed from the crystal.

The inventors have discovered that high quantum efficiency, high oscillator strength and thermally stable refractory oxide laser host crystals can be provided by removing the hydrogen from a high purity refractory oxide crystal and subsequently thermochemically reducing the oxygen in the crystal to produce oxygen anion vacancies therein.

SUMMARY OF THE INVENTION

It is therefore an object of this invention to provide refractory oxide crystals containing anion vacancies that have luminescence with high quantum efficiency, high thermal stability, broad tunability and are therefore useful as high power tunable laser hosts.

Another object of this invention is to provide a method of manufacturing refractory oxide crystals with the characteristics as set forth in the above object.

Refractory oxide crystals with high thermal stability and anion vacancy luminescence of high quantum efficiency and sufficiently short lifetimes are formed, in accordance with the present invention, by removing hydrogen from a 99.99% pure single crystal of the refractory oxide followed by a thermochemical reduction process at high temperatures. In this method, anion vacancies are created nonstoichiometrically, without oxygen interstitials. Therefore, unlike irradiated refractory oxide crystals, there are no interstitials to recombine with the vacancies. Therefore, the vacancies are stable at much higher temperatures (approximately 800° C.) and can survive accidental loss of refrigeration or rise in temperatures.

DETAILED DESCRIPTION OF THE INVENTION

An important feature of the herein-disclosed method of providing a refractory oxide crystal laser host having high quantum efficiency and high thermal stability for use in tunable lasers is based on the discovery that these crystals must be depleted in hydrogen (preferably, less than $10^{12}$ protons per cm$^3$) and thermochemically reduced at high temperatures and pressures in an atmosphere of the cation metal vapor to form oxygen (anion) vacancies in the crystal. This method produces crystals which possess no cation vacancies and are therefore immune to the formation of the detrimental trapped-hole centers when optically excited in the F$^+$ band. They are thermally much more stable compared to irradiated refractory oxide crystals. Therefore, crystals made in accordance with the present invention produce F$^+$ luminescence and therefore can be used as high power, cw tunable laser hosts. The removal of protons prior to thermochemical reduction gives rise to F$^+$ rather than F luminescence. The approximately $10^{-8}$ sec lifetime of the F$^+$ luminescence is achieved by sweeping out trace concentrations of protons by an electric field applied across the crystal at elevated temperatures. For materials which cannot be exposed to elevated temperatures without structurtal complications, such as phase change, precipitation of impurities, or change of stoichiometry, a method is used which involves ionizing radiation by electrons, attended by electric-field sweeping of protons. Either method is performed in a moisture-free atmosphere to prevent replacement of the protons by hydrogen ions from the atmosphere.

Figure 3:
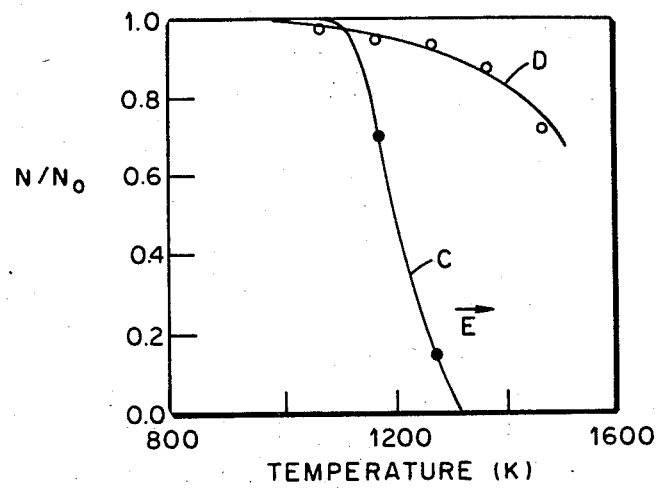
FIG. 3 is a graph illustrating the normalized concentration of OH$^-$ ions in MgO crystals versus annealing temperature in a dry nitrogen atmosphere with (Curve C) and without (Curve D) an electric field. An electric field of 2,000 v/cm was used. The samples had a thickness of 1.58 nm. Infrared absorption at 3296 cm$^{-1}$ was used to monitor the OH$^-$ concentration.

In accordance with one method of this invention for hydrogen removal, single crystals of a selected refractory oxide are used. These crystals may be grown by the submerged arc-fusion method which is described in U.S. Pat. No. 3,829,391 using high purity grade powder of the selected oxide. The crystal is sandwiched between two pressure point contacts. For a given material, there exists a temperature range and an electric field range at which prtons can be removed effectively. For MgO crystals, for example, an electric field of 2,000 v/cm is applied to the crystal for more than one hour at a temperature greater than approximately 1300K. The out-diffusion efficiency as a function of temperature using 2,000 v/cm is shown in FIG. 3. It is noted that at 1300K all the protons are effectively swept out by the electric field, whereas only 10% is removed if no field is applied.

In accordance with the other method of hydrogen removal, that is, at low temperatures, the crystal is subjected to ionizing electron irradiation and concurrently to an applied electric field. The crystals are preferentially cut with the largest parallel surfaces normal to the direction for C $||$ (C-parallel) diffusion, i.e., direction with the largest channel for least restricted proton diffusion through the crystal. Electrical contact may be made by coating the opposite surfaces with a precious metal contact (gold-platinum ink). The sample is supported vertically on one edge by a vise with an indium metal contact on one side (negative electrode), and a mica insulator on the other. Connection with the positive electrode side of the crystal is made with a spring contact formed of a wire such as tungsten. The crystal so configured is placed in a moisture-free atmosphere, such as a dry nitrogen or argon gas, or in a vacuum, and exposed to electron radiation while applying an electric potential to the electrodes so that an electric field is applied across the crystal in excess of about 2,000 volts/cm. The sample may also be heated moderately, if so desired, either by the heat generated by the electron beam, or by an external source.

The purpose of either heating or irradiating the crystal is to break the OH⁻ bonds. Applying an electric field provides direction for the protons and allows the protons to drift toward the cathode electrode.

When ionizing radiation is used to break the OH⁻ bonds the crystals are typically irradiated by exposure to electrons from a 2.0 MeV Van de Graaff generator with the beam intensity maintained at 8-9 microamps/cm$^2$. The dissociation cross section of the OH⁻ bond is a phenomenally large $10^8$ barns (1 barn = $10^{-24}$ cm$^2$) at room temperature.

In effect, the ionizing radiation replaces the high temperature in the dissociation OH⁻ ions. Once the protons are dissociated, they are swept by the electric field to the cathode electrode.

Once the crystal has been depleted in hydrogen, the crystal is processed thermochemically to reduce the oxygen. The crystal is placed in a tantalum basket which is inserted into a tantalum tube having one end sealed with a welded tantalum plug. Metal particles are also placed in the tube. The metal is preferably an element belonging to the cation of the crystal which is to be thermochemically reduced (Mg metal for MgO; Ca for CaO; etc.). The tube is then vacuum-sealed with a tantalum plug welded in the open end of the tube. The tube is then heated in an evacuated chamber at high temperatures (typically about 2,000° C.) for about one hour. At this temperature, the metal evaporates and the pressure of the metal vapor surrounding the sample is several atmospheres. Thermochemical reduction is taking place. Under these conditions, there exists a stoichiometric imbalance due to a deficiency of oxygen ions, resulting in the formation of oxygen anion vacancies. Equally important, from the mass action law, the cation vacancy concentration is dramatically reduced, thereby minimizing the formation of positive-ion vacancies and therefore trapped-hole centers. The crystal is maintained at this temperature within the tantalum oven for a period of about two hours.

EXAMPLE

Figure 1:
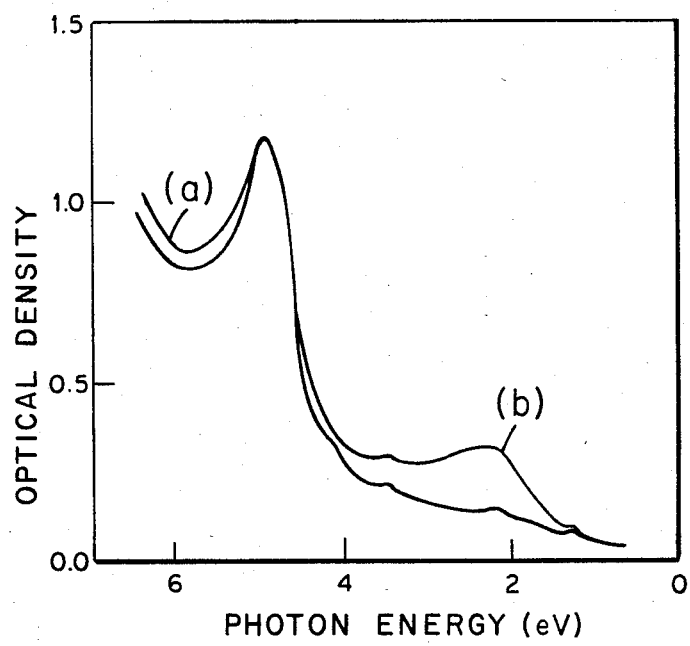
FIG. 1 is a graph illustrating the optical absorption spectra of a neutron irradiated MgO crystal (a) before and (b) after excitation with 4.9 eV light. The sample thickness is 1.51 mm.

An MgO crystal grown by the above-referenced arc-fusion method and prepared with electrodes as outlined above was heated to 1373K in a dry nitrogen atmosphere for 70 minutes with an applied electric field of 2,000 volts/cm to remove hydrogen. The hydrogen content was undetectable, indicating that the concentration was less than $10^{12}$ protons/cm$^3$ by infrared absorption in the region of 3000–4000 cm$^{-1}$. The MgO crystal was then thermochemically reduced in six atmospheres of magnesium vapor at about 2,220° K for two hours in a sealed tantalum tube as described above. Anion vacancies are produced nonstoichiometrically resulting in a concentration of about $10^{17}$ vacancies per cm$^3$ as determined from the optical absorption density of the anion vacancy band which peaks at 4.9 eV (250 nm). The spectrum after thermochemical reduction is shown by the dotted curve in FIG. 2. After excitation with 4.9 eV light, the spectrum remained essentially the same (solid curve in FIG. 2). The absorption band at 2.3 eV due to trapped-hole centers is notably absent. Furthermore, compared with FIG. 1, the low absorption and the flatness of the curves required for lasing action in the 1 to 4 eV region are apparent.

Figure 2:
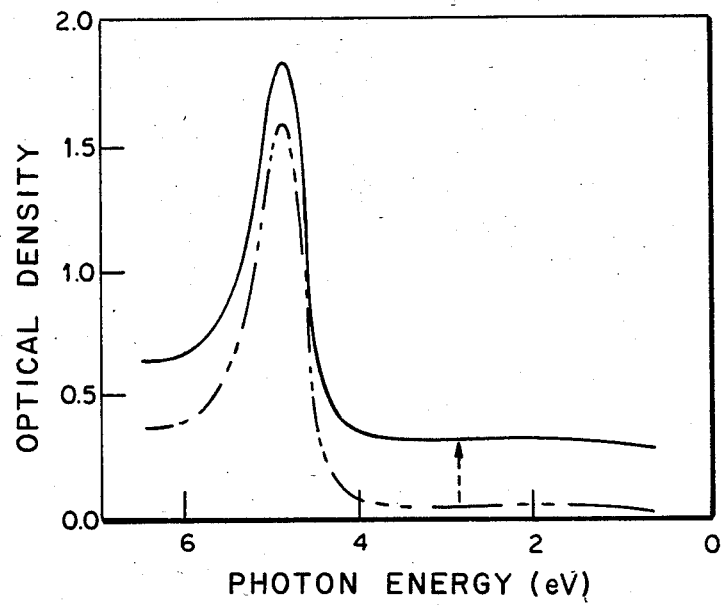
FIG. 2 is a graph illustrating the optical absorption spectra of a thermochemically reduced MgO crystal prepared in accordance with the present invention before (bottom) and after (top) excitation with 4.9 eV light. The sample thickness is 0.87 mm. The top curve is displaced upward to avoid overlapping of the two curves.

After thermochemical reduction the charge state of the anion vacancy is neutral (F center). During excitation into the F band, photoconversion occurs and both F$^+$ and F luminescence takes place, the latter being a long-lived phosphorescence with a peak at 2.3 eV (to be distinguished from the broad absorption peak at the same energy due to trapped-hole centers). The long-lived component of the F luminescence has been identified as due to the presence of H⁻ ions (protons in anion sites each with two electrons). Being positively charged with respect to the lattice, they serve as metastable traps for electrons excited from the F centers. Thus, the higher the H⁻ concentration, the longer is the phosphorescence lifetime. Also at a given temperature, a low H⁻ concentration gives rise to a larger F to F$^+$ luminescence intensity ratio at equilibrium. However, if protons are completely removed from an MgO crystal prior to thermochemical reduction, as in the sample whose spectra are shown in FIG. 2, only the F$^+$ luminescence occurs. This is a highly desirable effect because the gain coefficient of the F$^+$ emission is much larger than that for the F center. For the F center, the electronic wave function of the $1_{T_{1u}}$ excited state is too diffuse; its energy level is estimated to be within 0.01 eV of the conduction band. The F$^+$ center does not have this problem, because the $2\ T_{1u}$ excited state is sufficiently removed from the conduction band. It is therefore more desirable for use as a host for tunable lasers.

Besides the absence of trapped-hole centers, other advantages offered by thermochemically reduced MgO are thermal stability and high quantum efficiency of the luminescence. Anion vacancies in MgO crystals prepared by irradiation to form anion vacancies are not likely to survive prolonged periods at T > 360° K. Annihilation is due to mobile interstitials recombining with vacancies. In thermochemically reduced crystals, anion vacancies can readily survive 1,000° K, because there are no interstitials. The quantum efficiency of the F center in thermochemically reduced MgO is near unity at 300° K.

Although the invention has been described by means of an example employing MgO, it will be understood that other refractory oxide crystals may be prepared in like manner for laser host applications. The reason for this is that in a strongly reducing atmosphere of cation metallic vapor, anion vacancies are the predominant species rather than cation interstitials or cation metallic precipitate. More specifically, refractory oxides such as MgO, Al$_2$O$_3$, CaO and SrO are the preferred materials for laser hosts because they are normally stoichiometric.

In general, the trapped-hole centers in irradiated oxide crystals can be detrimental to cw tunable laser operation. Trapped-hole centers are not formed in thermochemically reduced refractory oxides when irradiated with photons or ionizing radiation. Furthermore, the extreme resistance of refractory oxides to form defects by particle irradiations can serve in a very positive manner: Optical devices using thermochemically reduced oxides can survive an environment of strong radiation fields, such as the Van Allen belt, without appreciable optical degradation.

1. A high power laser host material formed of a refractory oxide crystal characterized by high quantum efficiency and high thermal stability with a substantially complete depletion of hydrogen and containing sufficient oxygen anion vacancies to produce only F$^+$ luminescence when optically excited 2. The laser host material as in claim 1 wherein the hydrogen content is less than $10^{12}$ protons per cm$^3$.

3. The laser host material as in claim 2 wherein the concentration of oxygen anion vacancies is between $10^{16}$ and $10^{18}$ vacancies per $cm^3$.

4. The laser host material as in claim 3 wherein said refractory oxide crystal is an MgO single crystal.

5. A method of preparing a refractory oxide laser host material having high quantum efficiency and high thermal stability comprising the steps of:
  (a) removing hydrogen from a single crystal of said refractory oxide by dissociating hydrogen from the OH— bonds within said crystal and simulataneously applying an electric field across said crystal to sweep the dissociated hydrogen ions from said crystal to a concentration level of less than $10^{12}$ protons/$cm^3$; and
  (b) heating said crystal in an atmosphere of a cation of said refractory oxide at an elevated pressure to thermochemically reduce said crystal thereby forming oxygen vacancies within said crystal so that $F^+$ luminescence is produced when said crystal is optically excited.

6. The method of claim 5 wherein said dissociating step includes the step of heating said crystlal to a temperature sufficient to effect the dissociation of hydrogen from OH— bonds within said crystal.

7. The method of claim 5 wherein said dissociating step includes the step of irradiating said crystal with electrons to dissociate hydrogen from the OH— bonds within said crystal.

8. The method of claim 7 wherein said electric field is applied in a direction parallel to the direction for c ∥ diffusion of protons within said crystal wherein c ∥ diffusion is the direction for least restricted proton diffusion through said crystal.

9. The method of claim 5 wherein said refractory oxide is MgO and said heating step is carried out at a temperature in the range of about 2,000° K. to 2,400° K. in an atmosphere of magnesium vapor and at a pressure in the range of about 4–8 atmospheres.

10. The method of claim 5 wherein said refractory oxide is selected from the group consisting of MgO, CaO, $Al_2O_3$ and SrO.

* * * * *